United States Patent
Kuba et al.

(10) Patent No.: US 7,080,901 B2
(45) Date of Patent: Jul. 25, 2006

(54) PRINTING UNIT AND MANUFACTURING LINE FOR MANUFACTURING FLEXIBLE ORGANIC EL DISPLAY

(75) Inventors: Kenichi Kuba, Tokyo-to (JP); Hirofumi Nakajima, Tokyo-to (JP); Masaru Kobayashi, Tokyo-to (JP); Hiroyuki Shirogane, Tokyo-to (JP)

(73) Assignee: Dai Nippon Printing Co. Ltd., Tokyo (JP)

( * ) Notice: Subject to any disclaimer, the term of this patent is extended or adjusted under 35 U.S.C. 154(b) by 0 days.

(21) Appl. No.: 10/725,992

(22) Filed: Dec. 2, 2003

(65) Prior Publication Data
US 2005/0016405 A1    Jan. 27, 2005

(30) Foreign Application Priority Data
Dec. 3, 2002 (JP) ............................. 2002-350794
Dec. 3, 2002 (JP) ............................. 2002-350795

(51) Int. Cl.
*B41J 2/01* (2006.01)
*B41F 9/00* (2006.01)

(52) U.S. Cl. .................. 347/103; 101/154; 101/484

(58) Field of Classification Search ........... 101/41, 101/153, 350.6, 35, 484, 150, 170, 154; 347/19, 347/37, 38, 154, 158, 160, 169, 103
See application file for complete search history.

(56) References Cited

U.S. PATENT DOCUMENTS

| 5,343,234 | A  | * | 8/1994  | Kuehnle ...................... 347/128 |
| 5,678,483 | A  | * | 10/1997 | Johnson ....................... 101/153 |
| 6,029,573 | A  | * | 2/2000  | Capdeboscq ............... 101/350.6 |
| 6,397,740 | B1 | * | 6/2002  | Dubuit ........................ 101/41 |
| 6,427,591 | B1 | * | 8/2002  | Schmid .................... 101/351.8 |
| 6,732,643 | B1 | * | 5/2004  | Kwon et al. ................ 101/170 |
| 2002/0003397 | A1 |  | 1/2002  | Yamazaki |

FOREIGN PATENT DOCUMENTS

| JP | 10-077467   | 3/1998 |
| JP | 2003-059656 | 2/2003 |

\* cited by examiner

*Primary Examiner*—Shih-Wen Hsieh
(74) *Attorney, Agent, or Firm*—Harness, Dickey & Pierce, P.L.C.

(57) ABSTRACT

A printing unit include a plurality of ink supply members for supplying inks different from each other to a printing area or printing area-like portion, and a plurality of detecting systems, each detecting an amount of the corresponding ink accumulated on the printing area or printing area-like portion. A control system controls the plurality of ink supply members to regulate an amount of ink supplied by each of the plurality of ink supply members so as to bring the amount of the corresponding ink accumulated into agreement with a predetermined value

5 Claims, 6 Drawing Sheets

PRINTING UNIT AND MANUFACTURING LINE FOR MANUFACTURING FLEXIBLE ORGANIC EL DISPLAY

FIELD OF THE INVENTION

The present invention relates to the technical field of printing (coating) onto a web. Particularly, the present invention relates to a printing unit and a manufacturing line for manufacturing a flexible organic electroluminescent (EL) display that make it possible to apply a plurality of colors to a web by a single passage of the web through a single printing unit when printing ink of the same color (the same kind) in a pattern extending in a direction in which the web runs.

BACKGROUND ART

For example, the fabrication processes for an organic EL display include a process of applying organic EL light emitting layers in different patterns to a film specially processed to incorporate transparent or semitransparent electrode(s). The patterns are stripes extending in a direction in which the film runs and provided by applying each of regions isolated from each other in a lateral direction (a direction orthogonal to the direction in which the film runs) with one of inks for different organic EL light emitting layers. For three organic EL light emitting layers of different kinds, three inks of different kinds are applied using a plurality of printing units corresponding to the number of inks needed. A conventional method of coloring a film with three color inks requires three printing units for passage of the film through them one after another.

According to the prior art, accounting for the desired patterns of organic EL light emitting layers requires printing, at three different times, three laterally isolated regions of a film. Generally, the entire regions (the entire surface) of the film need to be printed one on top of an other, inevitably requiring comparatively uneconomical and bulky equipment. Printing pressure acts three times on the film that is processed to include transparent or semitransparent electrode(s) as pressure acts on the film during transfer operation at three printing units one after another. The repetitive application of pressure to the film may cause breakdown of the electrode(s) and limit emitting element(s) involved. In other words, the repeated application of printing pressure causes an increase in ratio of risk that the specially processed portion and light emitting layer of the film may lose their inherent characteristics.

SUMMARY OF THE INVENTION

The present invention has been devised to solve the above-mentioned problem, and an object of the present invention is to provide a printing unit and a manufacturing line for a flexible organic EL display that feature simple equipment for applying inks of different kinds to different regions with small ratio of risk that the printed product may lose its inherent characteristic.

The present invention provides a printing unit comprising: at least one printing area or printing area-like portion; a plurality of ink supply members for supplying inks different, in kinds, from each other to the printing area or printing area-like portion; a plurality of detecting systems, each detecting an amount of the corresponding ink accumulated on the printing area or printing area-like portion; and a control system for controlling the plurality of ink supply members to regulate an amount of ink supplied by each of the plurality of ink supply members so as to bring the amount of the corresponding ink accumulated into agreement with a predetermined value established for the ink detected.

According to the present invention, the plurality of ink supply members supply inks different in kind, to at least one printing area or area-like portion; there is a plurality of detecting systems, each detecting an amount of the corresponding ink accumulated on the printing area or printing area-like portion; and a control system that controls the plurality of ink supply members to regulate an amount of ink supplied by each of the plurality of ink supply members in such a way as to bring the amount of the corresponding ink accumulated into agreement with a predetermined value established for the ink detected. That is, with the one printing area, inks different in kind can be printed. Accordingly, the printing unit provided according to the present invention utilizes simple equipment for applying inks of different kinds to different regions with a small ratio of risk that the printed product may lose its inherent characteristic.

According to the present invention, there is provided the printing unit, wherein the printing area or printing area-like portion is a part of a gravure printing cylinder immediately upstream a doctor blade wiping an excess ink off the gravure printing cylinder.

According to the implementation of the present invention, there is provided, in gravure printing, a printing unit that can carry out printing to the printing area with inks of different kinds, which utilizes simple equipment and which has a small ratio of risk that the printed product may lose its inherent characteristic.

According to the present invention, there is provided the printing unit, wherein the printing area or area-like portion is a part of an offset gravure printing cylinder immediately upstream a doctor blade wiping an excess ink off the offset gravure printing cylinder.

According to the present invention, there is provided, in gravure offset printing, a printing unit that can carry out printing to the printing area with inks of different kinds, which utilizes simple equipment and which has a small ratio of risk that the printed product may lose its inherent characteristic.

According to the present invention, there is provided the printing unit, wherein the printing area or printing area-like portion is a part of an anilox roller of flexo printing immediately upstream a doctor blade wiping an excess ink off the anilox roller.

According to the implementation of the present invention, there is provided, in flexo printing, a printing unit that can carry out printing to the printing area with inks of different kinds, which utilizes simple equipment and which has a small ratio of risk that the printed product may lose its inherent characteristic.

According to the implementation of the present invention, there is provided the printing unit, wherein the printing area or printing area-like portion is an ink roller of offset printing.

According to the implementation of the present invention, there is provided, in offset printing, a printing unit that can carry out printing to the printing area with inks of different kinds, which utilizes simple equipment and which has a small ratio of risk that the printed product may lose its inherent characteristic.

According to the present invention, there is provided the printing unit, wherein the printing area or printing area-like portion is a part of a screen printing plate immediately upstream a squeegee wiping an excess ink off the screen printing plate.

According to the implementation of the present invention, there is provided, in screen printing, a printing unit that can carry out printing to the printing area with inks of different kinds, which utilizes simple equipment and which has a small ratio of risk that the printed product may lose its inherent characteristic.

According to the invention, there is provided the printing unit, wherein each of the plurality of ink supply members includes an ink container, a pump to deliver the ink out of the container, and a nozzle to eject the ink to the printing area or printing area-like portion.

According to the implementation of the present invention, the ink supply members send inks out of the ink containers by ink pumps to eject them out of nozzles toward the printing area or printing area-like portion.

According to the present invention, there is provided the printing unit, wherein each of the plurality of detecting systems includes a displacement sensor for detecting a surface portion of the accumulated ink.

According to the implementation of the present invention, the displacement sensor detects the surface portion of the accumulated ink, and therefore the detecting can be easily carried out.

According to the present invention, there is provided the printing unit, wherein the control system controls a flow rate of the ink delivered from the pump of each of the plurality of ink supply members to the nozzle so that the surface position of the ink is brought into agreement with a predetermined level.

According to the implementation of the present invention, the control system controls the ink pumps to regulate a discharge amount of ink supplied by each of the ink pumps. The discharge amount of ink supplied by each of the ink pumps is regulated by controllably operating the ink pumps.

According to the present invention, there is provided a manufacturing line for manufacturing an organic EL display, comprising: a first coating unit for producing a processed printed film that includes a printed film and an adhesive layer thereon formed by coating an adhesive to the printed film; and a laminating unit for laminating a processed multi-layered film including at least a barrier layer, a transparent or semi-transparent electrode, and an insulating layer to the processed printed film with automatic registration to produce a laminated film.

According to the present invention, the first coating unit produces a processed printed film that includes a printed film and an adhesive layer thereon formed by coating an adhesive to the printed film; and a laminating unit that laminates a processed multi-layered film including at least a barrier layer, a transparent or semi-transparent electrode, and an insulating layer to the processed printed film with automatic registration to produce a laminated film. Accordingly, a manufacturing line is provided that meets demand for mass-production, provides good yield and does not require any skilled labor.

According to the present invention, there is provided the manufacturing line, wherein the first coating unit includes a first feeder for feeding a film by unwinding the film from a first roll and a first printing unit for printing an image to the film to produce the printed film.

According to the implementation of the present invention, at the first feeder, the film is fed by unwinding the film from the first roll and, at the first printing unit, the image is printed to the film to produce the printed film. Thus, the manufacturing line has an in-line process for producing the printed film.

According to the present invention, there is provided the manufacturing line, further comprising a second feeder for feeding the processed multi-layered film to the laminating unit by unwinding the processed multi-layered film from a second roll.

According to the implementation of the present invention, at the second feeder, the processed multi-layered film is fed to the laminating unit by unwinding the processed multi-layered film from the second roll. Thus, the manufacturing line has an in-line process for producing the processed multi-layered film.

According to the present invention, there is provided the manufacturing line, further comprising a second coating unit for applying a hole-injection material to the laminated film from the laminating unit to form a hole-injection layer on the laminated film to produce a hole-injection layer coating film.

According to the implementation, the second coating unit applies the hole-injection material to the laminated film from the laminating unit to form the hole-injection layer on the laminated film to produce the hole-injection layer coating film. Thus, the manufacturing line has an in-line process for producing the hole-injection layer coating film.

According to the implementation of the present invention, there is provided the manufacturing line, further comprising a second printing unit for applying an organic EL ink to the hole-injection layer coating film to form a light emitting layer on the hole-injection layer coating film to produce a light emitting layer coating film.

According to the implementation of the present invention, the second printing unit applies the organic EL ink to the hole-injection layer coating film to form the light emitting layer on the hole-injection layer coating film to produce the light emitting layer coating film. Thus, the manufacturing line has an in-line process for producing the light emitting layer coating film.

According to the present invention, there is provided the manufacturing line, further comprising a cutting unit for cutting the light emitting layer coating film to pieces of a desired dimension.

According to the implementation of the present invention, the cutting unit cuts the light emitting layer coating film to pieces of the desired dimension. Thus, the manufacturing line has an in-line process for cutting the light emitting layer coating film to pieces of the desired dimension.

According to the implementation of the present invention, there is provided the manufacturing line, wherein the second printing unit comprises: at least one printing area or printing area-like portion; a plurality of ink supply members for supplying inks different, in kinds, from each other to the printing area or printing area-like portion; a plurality of detecting systems, each detecting an amount of the corresponding ink accumulated on the printing area or printing area-like portion; and a control system for controlling the plurality of ink supply members to regulate an amount of ink supplied by each of the plurality of ink supply members so as to bring the amount of the corresponding ink accumulated into agreement with a predetermined value established for the ink accumulated.

PREFERRED EMBODIMENTS OF THE INVENTION

First Embodiment

Figure 1:
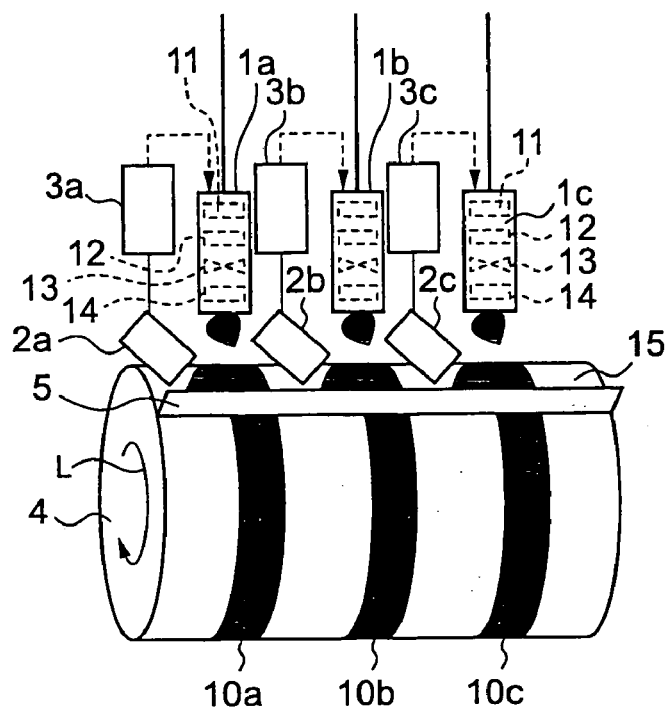
FIG. 1 is a perspective view illustrating one exemplary construction of a printing unit according to the present invention.
Figure 2:
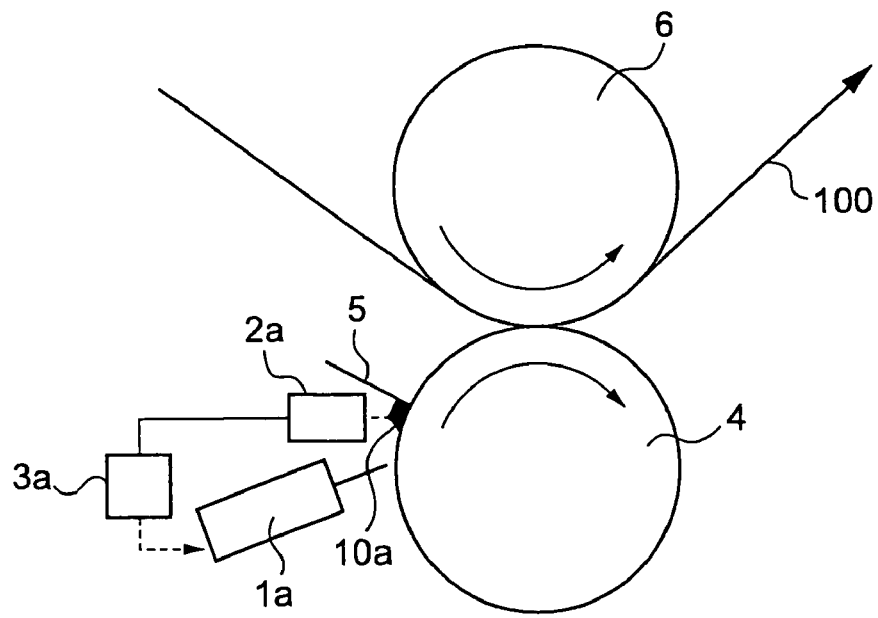
FIG. 2 is a side view illustrating the one exemplary construction of the printing unit according to the present invention.

Next, one embodiment according to the present invention is described. FIGS. 1 and 2 illustrate, as one example, the construction of a printing unit according to the present invention. In FIGS. 1 and 2, reference numerals 1a, 1b and 1c designate ink supply members, reference numerals 2a, 2b and 2c designate detecting systems, reference numerals 3a, 3b and 3c designate regulators of a control system, reference numeral 4 designates a printing cylinder, reference numeral 5 designates a doctor blade, reference numeral 6 designates a compression cylinder, reference numerals 10a, 10b and 10c designate inks, and reference numeral 100 designates a web.

The ink supply members 1a, 1b and 1c are arranged for supplying inks, which are different in color or kind from each other, to a printing area or printing area-like portion. Each of the ink supply members 1a, 1b and 1c includes, for example, an ink container 11 containing ink, an ink pump 12 to deliver the ink out of the container 11, and a nozzle 14 to eject the ink to the printing area or printing area-like portion. This construction employs a control arrangement wherein the ink pump 12, which provides supply of ink, is put in ON or OFF duty alternately to regulate an amount of ink supplied by the corresponding one of the ink supply members 1a, 1b and 1c.

Each of the ink supply members 1a, 1b and 1c may include an electromagnetic valve 13 between an ink pump 12 and the associated nozzle 14. The electromagnetic valve 13 is opened or closed alternately to regulate an amount of ink supplied by the corresponding one of ink supply members 1a, 1b and 1c. In this case, it is necessary to feed ink under pressure to the electromagnetic valve 13. Thus, the ink pump 12 is activated to discharge ink under pressure. If desired, gravity may be utilized to apply pressure to ink by elevating an ink container 11. In this case, the ink pump 12 may be eliminated from the unit.

In FIGS. 1 and 2, the printing area or printing area-like portion is a part 15 of a gravure printing cylinder 4 immediately upstream a doctor blade 5 wiping an excess ink off the printing cylinder 4. As the printing cylinder 4 rotates in a direction as indicated by arrows (see FIG. 2), the inks supplied to the above-mentioned part 15 by the ink supply members 1a, 1band 1c, respectively, are brought to a terminal segment of the doctor blade 5 kept in contact with the printing cylinder 4. Excess inks, which have failed to be received in gravure cells of the printing cylinder 4, are stopped by the terminal segment of the doctor blade 5 and accumulated. An amount of each ink accumulated incrases if the rate of supply of the ink exceeds the rate of consumption of the ink by the gravure cell, while it decreases if the rate of supply of the ink is less than the rate of consumption of the ink by the gravure cells.

Figure 5:
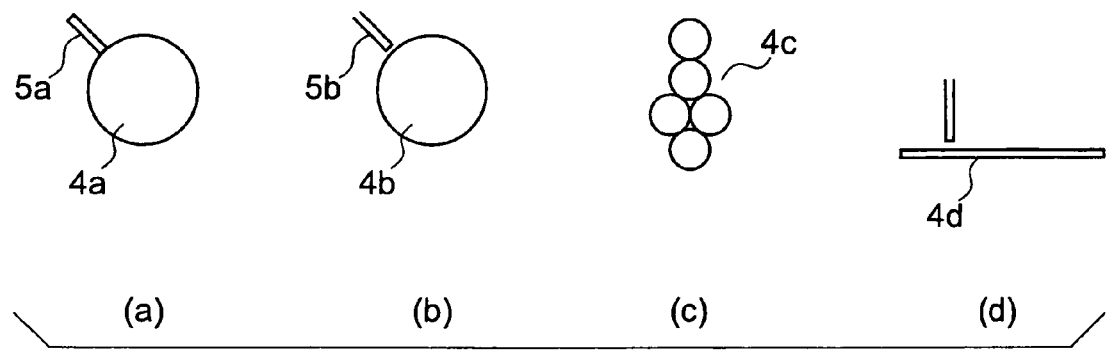
FIG. 5 is a view illustrating modifications of a printing unit according to the present invention.

In other modifications of a printing unit, as shown in FIGS. 5(a) to 5(b), the printing area or printing area-like portion is a part of an offset gravure printing cylinder 4a immediately upstream a doctor blade 5a wiping an excess ink off the offset gravure printing cylinder 4a, or a part of an anilox roller 4b of flexo printing immediately upstream a doctor blade 5b wiping an excess ink off the anilox roller 4b, or an ink roller 4c of offset printing, or a part of a screen printing plate 4d immediately upstream a squeegee wiping an excess ink off the screen printing plate 4d. The printing area or printing area-like portion is herein used to mean a portion of any printing system, which portion can apply different inks directly or indirectly to a printing substrate at regions isolated from each other in a lateral direction (a direction orthogonal to the direction in which the printing substrate runs). The printing area or printing area-like portion is applicable to any printing system without any limitation.

Available as the ink roller 4c of offset printing are rollers of an inking roller train, which includes, for example, an ink fountain roller, an ink metering roller, an ink distributing roller, and an inking roller. Accounting for printing conditions, an appropriate one of them is selected as the ink roller 4c, to which the ink supply members 1a, 1b and 1c supply inks. Supplying inks to an ink distributing roller or an inking roller is preferable in order to prevent inks from spreading in the lateral direction after resting on a printing cylinder.

The detecting systems 2a, 2b and 2c are provided, each detecting an amount of the corresponding one of different inks 10a, 10b and 10c accumulated on the printing area or printing area-like portion 15. Each of the detecting systems 2a, 2b and 2c is a displacement sensor for detecting a surface position of the corresponding one of the accumulated inks 10a, 10b and 10c since the surface position indicates the amount of the corresponding ink accumulated. The surface position of each of the accumulated inks 10a, 10b and 10c approaches to the corresponding one of the displacement sensors 2a, 2b and 2c if the rate of supply of the ink exceeds the rate of consumption of the ink by the gravure cells, while it goes away if the rate of supply of the ink is less than the rate of consumption of the ink by the gravure cells. Each of the displacement sensors 2a, 2b and 2c provides, as an output, a displacement signal indicative of a distance to the surface position of the corresponding one of the accumulated inks 10a, 10b and 10c.

The displacement sensors 2a, 2b and 2c are in the form of a laser displacement sensor. The laser displacement sensors project a beam of visible laser that creates a spot on the target surface. Reflected light from the surface is viewed from an angle by a line scan camera and the distance to the surface is computed, using triangulation method, from the image pixel data. Other types of displacement sensors like ultrasonic displacement sensors and electrostatic capacity type displacement sensors may be used. The present invention is not limited by types of displacement sensors used.

The control system includes regulators 3a, 3b and 3c and controls the plurality of ink supply members 1a, 1b and 1c to regulate an amount of ink supplied by each of the plurality of ink supply members 1a, 1b and 1c in such a direction as to bring the amount of the ink detected by the corresponding one of the plurality of detecting systems 2a, 2b and 2c into agreement with a predetermined value established for the ink detected. The regulators of the control system 3a, 3b and 3c controls the pumps 12 to regulate an amount of ink discharged by each of the pumps 12 in such a direction as to bring the surface position of the accumulated ink into agreement with a predetermined surface position established for the accumulated ink. Each of the regulators 3a, 3b and 3c receives the displacement signal indicative of distance to the target ink surface, detected by the corresponding one of the detecting systems 2a, 2b and 2c, to the corresponding one of the ink supply members 1a, 1b and 1c. The regulators 3a, 3b and 3c compute a deviation between the detected displacement and a predetermined displacement (target value), and carries out duty-ON and duty-OFF of the ink pumps 12 or electromagnetic valves 13 of the ink supply members 1a, 1b and 1c when the deviation fails to reach the lower limit of an allowable range and when it exceeds the upper limit of the allowable range respectively.

If a higher precision control than the ON/OFF control is necessary, each of the regulators 3a, 3b and 3c computes a control amount on the basis of a PID control that includes at least one of a proportional control an integral control action, and a derivative control action. Based on the computed control amount, the driving speed of the ink pumps 12 or the opening rate of the electromagnetic valves 13 of the ink supply members 1a, 1b and 1c are regulated.

Next, the operation of printing unit is described. The start-up procedure for printing is initiated by passing the web 100 over the entire path through the printing unit. In FIG. 2, the web 100 is passed through a clearance opened between the printing cylinder 4 and the compression cylinder 6 by shifting the compression cylinder 6 to a rest position. Subsequently, the web 100 is interposed between the printing cylinder 4 and the compression cylinder 6 by shifting the compression cylinder 6 to a work position in which the compression cylinder 6 is pressed so as to firmly engage with the printing cylinder 4 to apply printing pressure to the web 100.

Next, the blade end of doctor blade 5 is brought into contact with the printing area on the printing cylinder 4 by shifting the doctor blade from a rest position to a work position.

Next, the printing unit is put into operation. The web 100 is pulled and tensioned by rotation of the printing cylinder 4, the compression cylinder 6, a pair of in-feed rollers (not shown) upstream of the printing unit, and a pair of out-feed rollers (not shown) downstream of the printing unit.

Next, the ink supply members 1a, 1b and 1c, the detecting systems 2a, 2b and 2c, and the control system including regulators 3a, 3b and 3c are operated. Initially, as no ink is accumulated between the doctor blade 5 and the printing cylinder 4, the ink supply members 1a, 1b and 1c supply inks to the printing area or printing area-like portion. Each of the detecting systems 2a, 2b and 2c detects an amount of the corresponding ink accumulated. The control system including the regulators 3a, 3b and 3c controls the plurality of ink supply members 1a, 1b, 1c to regulate an amount of ink supplied by each of the plurality of ink supply members 1a, 1b and 1c in such a direction as to bring the amount of the ink accumulated into agreement with a predetermined value established for the ink accumulated.

Next, as the printing cylinder 4 rotates, the supplied inks 10a, 10b and 10c are allowed to fill in gravure cells within the printing area. Within the printing area of the printing cylinder 4, the gravure cells occupy three stripe-like regions extending in a direction in which the web runs and located at different locations spaced from each other in a lateral direction orthogonal to the direction in which the web runs. FIG. 1 shows three different inks 10a, 10b and 10c filling the gravure cells, respectively.

Next, as the printing cylinder 4 rotate, the inks 10a, 10b and 10c are transferred to the web 100 where the web 100 is pressed into firm contact with the printing cylinder 4 to print an image on the web 100. In accordance with a transfer rate, each of the gravure cells loses a portion, in mass, of the ink, causing a drop, in mass, of the ink remaining in the gravure cell. Three stripe-like printing patterns are printed on the web 100 with different inks 10a, 10b and 10c, respectively (see FIG. 3).

As the printing cylinder 4 is further rotated, the gravure cells return to portions which have the accumulated inks, receiving the accumulated inks to compensate for the drop in mass of ink remaining in the gravure cell. Printing of the image to the web 100 continues by repeating a cycle of transfer of ink from each of the gravure cells to the web 100 and supply of ink to the gravure cell to compensate for the drop lost by the previous transfer.

As mentioned above, the supply of an amount of ink to each of the gravure cells takes place where the ink is accumulated, reducing the accumulated amount of the ink. This reduction in the accumulated amount of each of the inks is detected by one of detecting systems 2a, 2b and 2c. This detected reduction is complemented for by ink supplied by one of the supply members 1a, 1b and 1c, which are controlled by the control system including the regulators 3a, 3c and 3d. The control system regulates an amount of ink supplied by each of the plurality of ink supply members 1a, 1b and 1c in such a direction as to bring the amount of the ink accumulated into agreement with a predetermined value established for the ink accumulated.

The end procedure for printing is initiated by shifting the compression cylinder 6 from the work position to the rest position. This opens the clearance between the printing cylinder 4 and the compression cylinder 6, reducing the pressure applied to the web 100 to zero, bringing the printing to an end.

The subsequent procedure step is to stop movement of the web 100, allowing the printing cylinder 4 to come to a halt. As the accumulated amount of each of the inks is controlled, the accumulated amount of the ink will not exceed the predetermined value upon and after stopping the printing.

The next procedure step is to stop the ink supply members 1a, 1b and 1c, the detecting systems 2a, 2b and 2c, and the control system including the regulators 3a, 3b and 3c.

The next procedure step is to shift the doctor blade from the work position to the reset position, disengaging the blade end of the doctor blade 5 from the printing area of the printing cylinder 4.

The next procedure step is to clean the printing cylinder 4, doctor blade 5 and the like to wipe remaining ink off them.

Figures 3, 4:
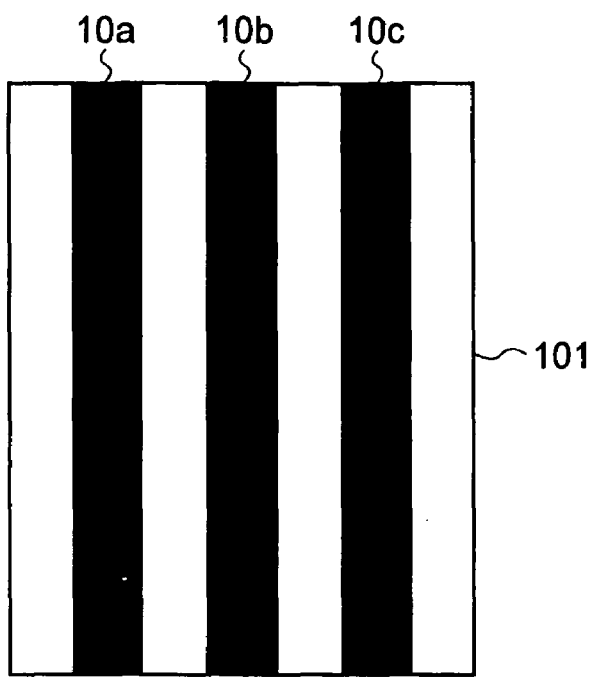
FIG. 3 is a view illustrating one example of a printing product provided by the printing unit according to the present invention.
FIG. 4 is a view illustrating another example of a printing product provided by the printing unit according to the present invention.

The operation has been described. Next, the products printed by the printing unit according to the present invention are described. FIG. 3 shows an example of the printed products. FIG. 3 shows a printing product 101 resulting from one rotation of the printing cylinder 4. The printing product 101 has three striped-like printing patterns colored with inks 10a, 10b and 10c, respectively. The inks 10a, 10b and 10c are supplied by the independent ink supply members 1a, 1b and 1c to gravure cells occupying independent regions within the printing surface of the printing cylinder 4, respectively. Thus, different kinds of ink may be used as inks 10a, 10b and 10c. In this manner, by passing the web 100 through a single printing unit, the printing product 101 (colored) can be produced using a plurality kinds of inks.

FIG. 4 shows another example of the printed products by the printing unit according to the present invention. FIG. 4 shows a printing product 102 resulting from one rotation of the printing cylinder 4. The printing product 102 has different arrays [1, 2, 3, . . . ], [a, b, c, . . . ], and [A, B, C . . . ]. These arrays are printed with different inks 10a, 10b and 10c, which are supplied by the independent ink supply members 1a, 1b and 1c to gravure cells occupying independent regions within the printing surface of the printing cylinder 4, respectively. Thus, different kinds of ink may be used as inks 10a, 10b and 10c. In this manner, by passing the web 100 through a single printing unit, the printing product 102 (colored) can be produced using a plurality kinds of inks.

In the preceding description, the present invention was described along with its implementation. It will be apparent from the previous description that the printing units, which the present invention relates to, should not be construed in a narrow interpretation only to printing units used to print books. Generally, the term "coating" is used to mean forming a film without any pattern, while the term "printing" is used to mean forming a film with pattern (shadow). The printing units of the present invention, are printing units in a broad interpretation and include coating units in a broad interpretation, for example roll coaters. In the implementation of the present invention, the printing unit is a unit forming a film with pattern, that is, a unit forming patterns of different physical properties, which are spaced in a lateral direction (orthogonal to a direction in which a web runs).

As will be understood from the preceding description, according to the implementation of the present invention, there is provided a printing unit, which can carry out printing to at least one printing area with inks of different kinds, which is of simple equipment and which has a small ratio of risk that the printed product may lose its inherent characteristic.

According to the implementation of the present invention, there is provided, in gravure printing, the printing unit, which can carry out printing to the printing area with inks of different kinds, which is of simple equipment and which has a small ratio of risk that the printed product may lose its inherent characteristic.

According to the implementation of the present invention, there is provided, in gravure offset printing, the printing unit, which can carry out printing to the printing area with inks of different kinds, which is of simple equipment and which has a small ratio of risk that the printed product may lose its inherent characteristic.

According to the implementation of the present invention, there is provided, in flexo printing, the printing unit, which can carry out printing to the printing area with inks of different kinds, which is of simple equipment and which has a small ratio of risk that the printed product may lose its inherent characteristic.

According to the implementation of the present invention, there is provided, in offset printing, the printing unit, which can carry out printing to the printing area with inks of different kinds, which is of simple equipment and which has a small ratio of risk that the printed product may lose its inherent characteristic.

According to the implementation of the present invention, there is provided, in screen printing, the printing unit, which can carry out printing to the printing area with inks of different kinds, which is of simple equipment and which has a small ratio of risk that the printed product may lose its inherent characteristic.

According to the implementation of the present invention, the ink supply members send inks out of the ink containers by ink pumps to eject them out of nozzles toward the printing area or printing area-like portion.

According to the implementation of the present invention, the detecting systems are displacement sensors that detect surface positions of the inks accumulated as the accumulation amounts of the inks, making it very simple to measure the accumulation amounts of the inks.

According to the implementation of the present invention, the control system includes the regulators for controlling the ink pumps to regulate a discharge amount of ink supplied by each of the ink pumps. The discharge amount of ink supplied by each of the ink pumps is regulated by controllably operating the ink pumps.

Second Embodiment

Figure 6:
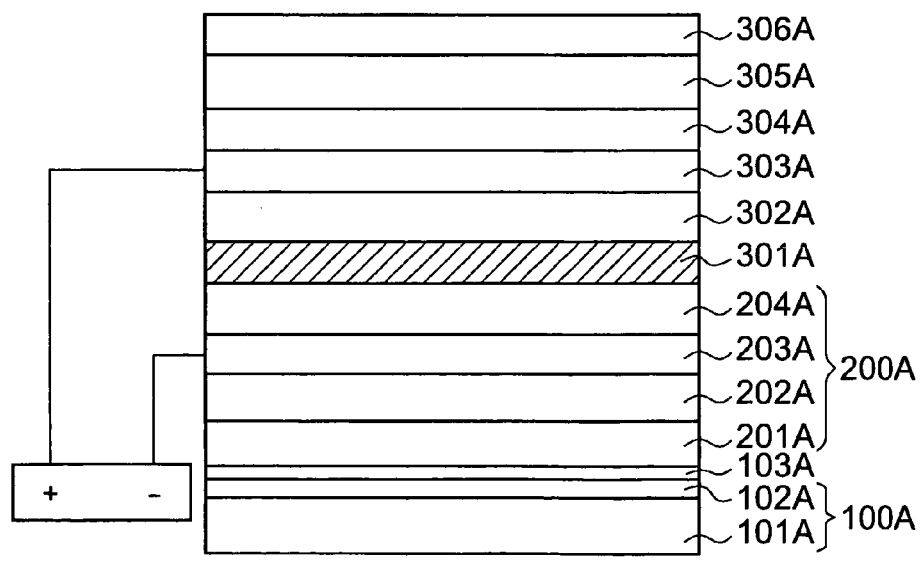
FIG. 6 is a cross sectional view illustrating one example of a layered structure of a flexible organic EL display manufactured by a manufacturing line according to the present invention.

With reference, next, to this implementation, the present invention is described. FIG. 6 is a cross sectional view illustrating one example of a layered structure of a flexible high polymer organic EL display manufactured by a manufacturing line according to the present invention. In FIG. 6, reference numeral 101A designates a film, reference numeral 102A designates a printing layer, reference numeral 103A designates an adhesive layer, reference numeral 201A designates a film, reference numeral 202A designates a barrier layer, reference numeral 203A designates a transparent electrode, reference numeral 204A designates an insulating layer, reference numeral 301A designates a light emitting layer (an electron transport layer, a light emitting layer, a hole injection layer), reference numeral 302A designates a metal layer of a low work function material, reference numeral 303A designates an electrode (transparent), reference numeral 304A designates an adhesive layer, the reference numeral 305A designates a barrier layer, the reference numeral 306A designates a film.

Figure 7:
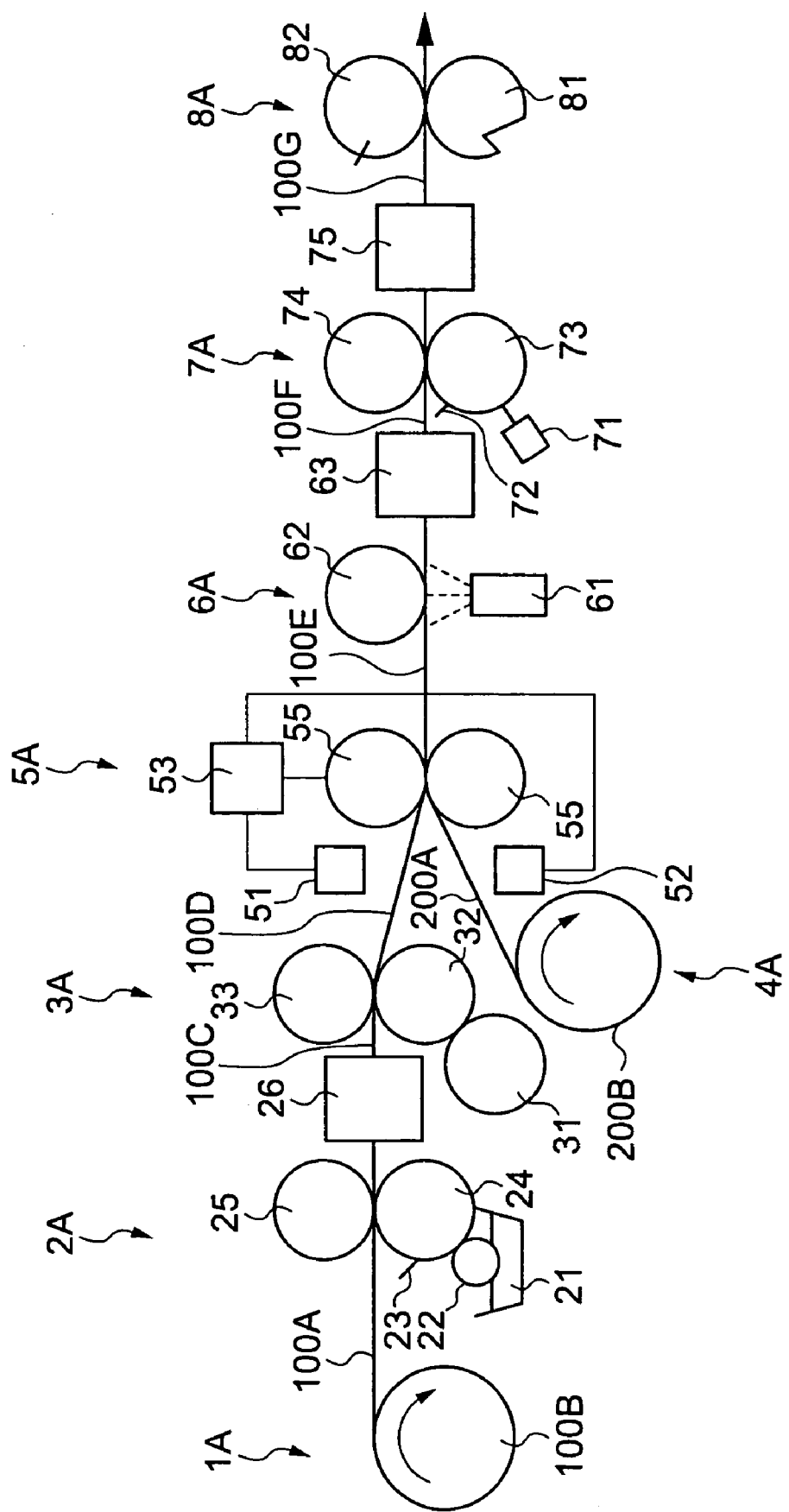
FIG. 7 is an explanatory view illustrating one example of construction of a manufacturing line according to the present invention.

Referring to FIG. 7, the manufacturing line according to the present invention for manufacturing the flexible high polymer organic EL display of the above-mentioned configuration is described. FIG. 7 is an explanatory view illustrating one example of construction of the manufacturing line according to the present invention. In FIG. 7, reference numeral 1A designates a first feeder, reference numeral 2A designates a first printing unit, reference numeral 3A designates a first coating unit, reference numeral 4A designates a second feeder, reference numeral 5A designates a laminating unit, reference numeral 6A designates a second coating unit, reference numeral 7A designates a second printing unit, and reference numeral 7A designates a cutting unit. In FIG. 7, the reference numeral 100B designates a first roll, and the reference numeral 200B designates a second roll. The first roll 100B includes a film 100A that constitutes one layer of the structure shown in FIG. 6. The second 200B includes a processed multi-layered film 200A that constitutes one layer of the structure shown in FIG. 6 and includes the film 201A, the barrier layer 202A, the transparent electrode 203A, and the insulating layer 204A.

The first feeder 1A feeds the film 100A to the first printing unit 2A by unwinding the film 100A from the first roll 100B. Although not illustrated in FIG. 7, it is preferred to equip the first feeder 1A with a support shaft supporting the first roll 100B, a mechanism applying brake or reverse torque to the support shaft supporting the first roll 100B in order to apply tension to the film 100A, a pair of feed rollers driven to rotate to send the film 100A interposed between them at a predetermined speed, and a dancer roller detecting tension on the film 100A upon being supplied.

The first printing unit 2A prints an image to the printing layer 102A of the film 100A to produce a printed film 100C. When overprinting is necessary, the number of printing units can be increased. The first printing unit 2A includes an ink pan 21, a finisher roller 22, a doctor blade 23, a printing cylinder 24, a compression cylinder 25, and a dryer 26. Although it is in the form of a printing unit for gravure printing in FIG. 7 the first printing unit 2A may be a printing unit for other printing like offset printing or flexo printing.

The first coating unit 3A produces a processed printed film 100D by forming the adhesive layer 103A on the printed film 100C by coating an adhesive thereto. The first coating unit 3A includes three rollers 31, 32 and 33. The roller 31 delivers coating liquid (adhesive) through its surface to an adjustable clearance between the rollers 31 and 32 so that the flow rate of the coating liquid is regulated by the clearance of the rollers 32 and 33, and then the coating liquid is transferred to the printed film 100C that is positioned between to the rollers 32 and 33. Although, not shown in FIG. 6, the first coating unit 3A may have a dryer to dry the film after the coating process if the coating liquid used contains solvent.

The second feeder 4A feeds a processed multi-layered film 200A to the laminating unit 5A by unwinding the processed multi-layered film 200A from a second roll 200B. The processed multi-layered film 200A includes the film 201A, the barrier layer 202A, the transparent electrode 203A and the insulating layer 204A. Although not shown in FIG. 7, it is preferred to equip the second feeder 4A with a support shaft supporting the second roll 200B, a mechanism applying brake or reverse torque to the support shaft supporting the second roll 200B in order to apply tension to the processed multi-layered film 200A, a pair of feed rollers driven to rotate to send the processed multi-layered film 200A interposed between them at a predetermined speed, and a dancer roller detecting tension on the multi-layered film 200A upon being supplied. It is preferred to provide the laminating unit 5A with web-edge guide and the second roll 200B with side-lay for lateral registration between the processed printed film 100D and the processed multi-layered film 200A.

The laminating unit 5A (laminator) laminates the processed printed film 100D to the processed multi-layered film 200A with automatic registration to produce a laminated film 100E. The laminating unit 5A includes a pair of rollers 54 and 55 that are designed to interpose therebetween the processed printed film 100D and the processed multi-layered film 200A and then to thermally press one on top of the other into firm engagement with each other. Further, the laminating unit 5A includes a mark sensor 51 for detecting registration mark 51A on the processed printed film 100D, a mark sensor 52 for detecting registration mark (transparent insulating layer) 52A on the processed multi-layered film 200A, and a registration controller 53. Although not shown in FIG. 7, it is preferred to provide, as a regulator (an operator) for registration control, a compensator roller and a tension adjuster in the path for one of the processed printed film 100D and the processed multi-layered film 200A. The laminating unit 5A will be described later in more detail.

The second coating unit 6A applies a hole-injection material to the laminated film 100E to form a hole-injection layer 301A thereon to produce a hole-injection layer coating film 100F. In FIG. 7, the second coating unit 6A is of the spray coating type. The second coating unit 6A includes a spray-coating head 61, a roller 62 supporting the laminated film 100E from the back to restrain the coating position, and a dryer 63. It is not intended to limit the second coating unit 6A to one unit of the spray coating type, but the second coating unit 6A may take any coating type in which the hole-injection material can be applied evenly to the substrate, such as, die coating type, roll coating type and gravure coating type.

The second printing unit 7 applies a high polymer organic EL ink (called also as organic EL ink) to the hole-injection layer coating film 100F to form a light emitting layer 301A thereon to produce a light emitting layer coating film 100G. In order to emit three colors RGB (red, green, blue) for producing a flexible high polymer organic EL display, a plurality of light emitting layers 301A of different kinds need to be formed. In FIG. 7, the second printing unit 7A is in the form of a printing unit whereby a plurality of light emitting layers 301A can be printed. The second printing unit 7A may take the form of a printing unit for other printing like gravure printing, flexo printing, offset printing, gravure offset printing, and screen printing.

The second printing unit 7A includes ink supply members 71, a doctor blade 72, a printing cylinder 73, a compression cylinder 74 and a dryer 75. The ink supply members 71 are arranged laterally with respect to the printing cylinder 73 for supplying inks of different kinds, respectively, to printing area on the single printing cylinder 73. The doctor blade 72 is arranged to wipe excess inks off the printing cylinder 73, accumulating mass of inks between the doctor blade 72 and the printing area on the printing cylinder 73. The second printing unit 7A may take the form of the printing unit described in the first embodiment in FIGS. 1–5. The second printing unit 7A includes detecting systems, each detecting an amount of the corresponding one of inks of different kinds accumulated on the printing area, and a control system for controlling the plurality of ink supply members to regulate an amount of ink supplied by each of the plurality of ink supply members in such a direction as to bring the amount of the ink accumulated into agreement with a predetermined value established for the ink accumulated. With the printing unit, inks of different kinds can be printed to a single printing area.

The printing area on the printing cylinder 73 is formed with printing patterns including stripes that are laterally spaced and extend in a direction in which the substrate runs. The hole-injection layer coating film 100F is interposed between the printing cylinder 73 and the compression cylinder 74 and has printing pressure applied thereto. After the printing, it is dried within the dryer 75. The light emitting layer coating film 100G thus produced in the above-mentioned processes has printed stripe-like light emitting layers 301A of different kinds that are laterally spaced and extend in the longitudinal direction.

A plurality of printing units corresponding in number to a plurality of light emitting layers 301A of different kinds may be provided to print the emitting layers 301A, respectively, without using the single printing unit.

If the light emitting layers 301A do not involve any electron transport layer, a third coating unit is provided downstream the dryer 75 to coat the light emitting layer coating film 100G with electron transport layers.

The cutting unit 8A cuts the light emitting layer coating film 100G to pieces of a desired dimension to produce sheets of the light emitting layer coating film 100G. The cutting unit 8A may be of any of the well known types. The present invention is not limited by the kinds or types of the cutting unit 8A.

In the preceding description, the manufacturing line for manufacturing a flexible high polymer organic EL display according to the present invention has been described.

Next, the laminating unit 5 is now described in detail. As described before, the laminating unit 5A laminates the processed printed film 100D to the processed multi-layered film 200A with automatic registration to produce the laminated film 100E. For automatic registration, the laminating unit 5A includes the mark sensor 51 for detecting registration mark 51A on the processed printed film 100D, the mark sensor 52 for detecting registration mark (transparent insulating layer) 52A on the processed multi-layered film 200A, and a registration controller 53.

Figure 8:
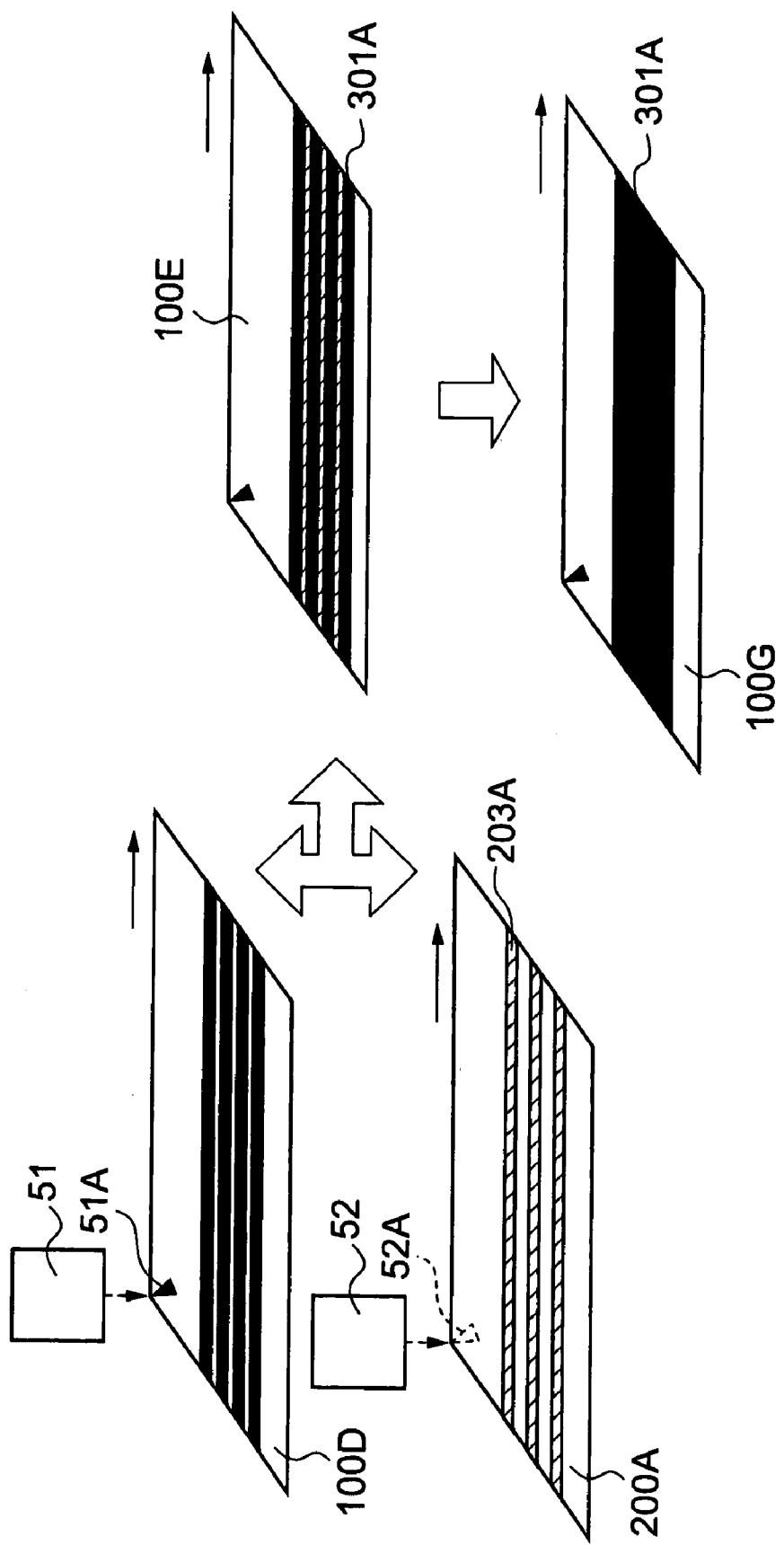
FIG. 8 is an explanatory view of process to produce a laminated film with automatic registration.

FIG. 8 is an explanatory view of process to produce a laminated film with automatic registration. As shown in FIG. 8, when the processed printed film 100D runs, the registration mark sensor 51 detects registration mark 51A on the processed printed film 100D. The registration mark 51A is printed when producing the printed film 100c by printing. The registration mark sensor 51 that detects the registration mark 51A on the processed printed film 100D may take the form of a well known optical mark sensor. The present invention is not limited by kinds or forms of registration mark sensor 51.

When the electrode equipped film (or processed multi-layered film) 200A runs, the registration mark sensor 52 detects registration mark 52A on the electrode equipped film 200A. The registration mark 52A is patterned when patterning the transparent electrode layer 203A of the electrode equipped film 200A. The registration mark 52A is transparent so that the well known optical mark sensor cannot be used as the mark sensor 52 for detecting the registration mark 52A of the electrode equipped film 200A.

As the registration mark sensor 52, a mark sensor of special kind and form only may be utilized. A sensor 52 having a sensing form of measuring the film thickness of the transparent electrode layer 203A (0.02~0.4 μm thick) can be used as the registration mark sensor 52. Because the transparent electrode absorbs light within a range of short wavelengths of visible ray, an optical sensor that employs a special form of detecting a measuring value difference between the transparent electrode and the film substrate by limiting spectra wavelength of projected light and spectra sensitivity of a light receiving element to the range of short wavelength, is also usable as the registration mark sensor 52.

Figure 9:
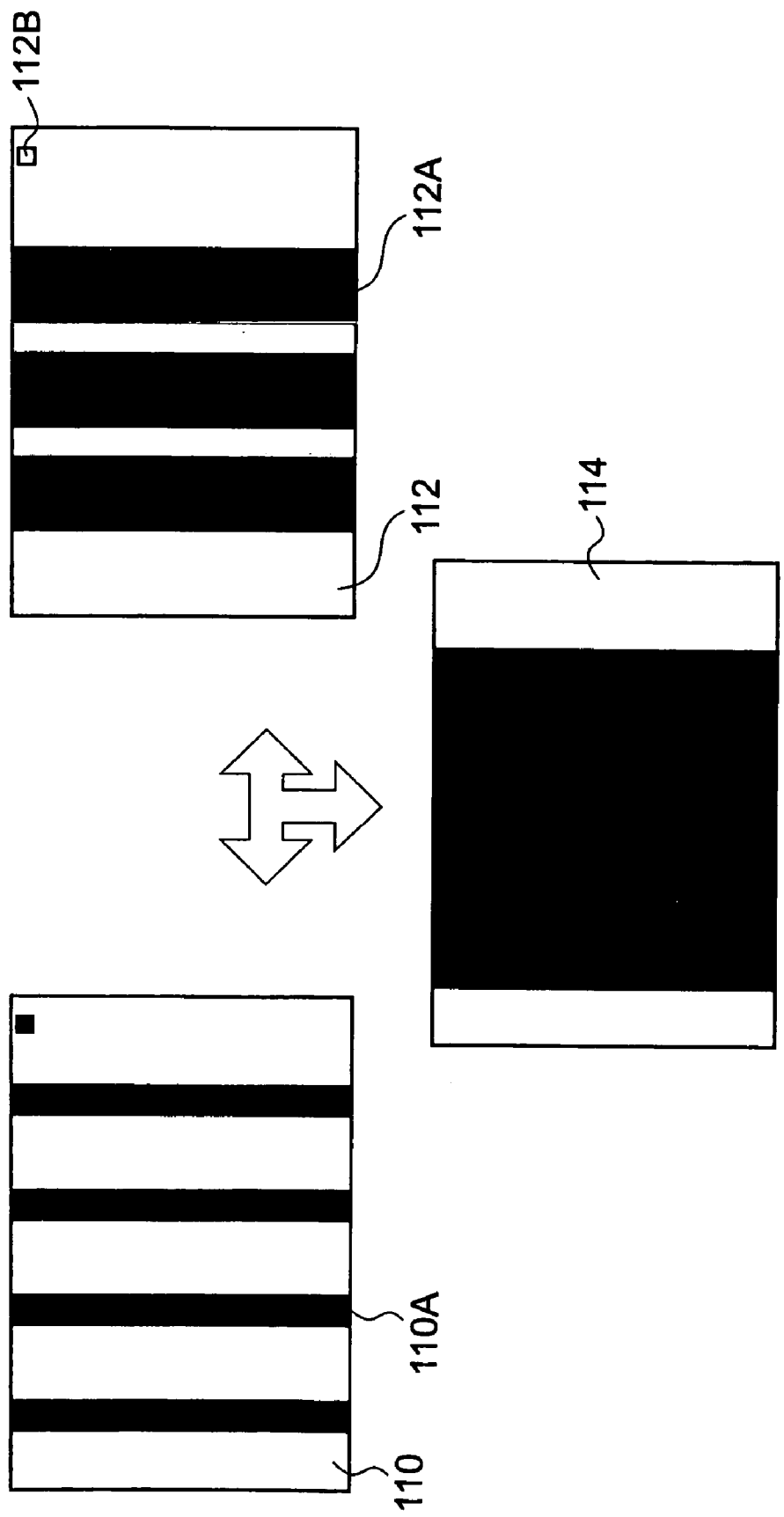
FIG. 9 is an explanatory view illustrating a conventional method for manually laminating films one on top of the other.

FIG. 8 shows a method according to the present invention for laminating films with automatic registration using the above-mentioned resignation mark sensors. FIG. 9 shows a conventional method for manually laminating films one on top of the other, which would be inevitably chosen if registration mark sensors are unavailable. In FIG. 9, a sheet-like film 110 of the printed layer 110A is laminated to a sheet-like film 112 including an EL light emitting layer 112A and resignation mark 112B to produce a light emitting layer film 114.

Thus, according to the present invention, a manufacturing line is provided, which meets demand for mass-production, provides good yield and requires any skilled labor.

The manufacturing line according to the present invention can achieve an in-line process for producing a printed film.

The manufacturing line according to the present invention can achieve an in-line process of supplying a processed multi-layered firm.

The manufacturing line according to the present invention can achieve an in-line process of process of forming a hole-injection layer to produce a hole-injection layer coating film.

The manufacturing line according to the present invention can achieve an in-line process of printing high polymer organic EL light emitting material to form light emitting layers to produce a light emitting layer coating film.

The manufacturing line according to the present invention can achieve an in-line process of cutting the light emitting layer coating film into pieces of a predetermined dimension.

The invention claimed is:

1. A printing unit comprising cylinder:
   a printing cylinder;
   at least one printing area or printing area like portion;
   a plurality of ink supply members for supplying inks different, in kinds, from each other to the printing area or printing cylinder;
   a doctor blade provided on the printing cylinder immediately downstream with respect to the ink supply members, for wiping an excessive ink;
   a plurality of detecting systems, each detecting an amount of the corresponding ink accumulated on the printing area of the printing cylinder; and
   a control system for controlling the plurality of ink supply members to regulate an amount of ink supplied by each of the plurality of ink supply members so as to bring the amount of the corresponding ink accumulated into agreement with a predetermined value established for the ink detected,
   wherein each of the plurality of detecting systems includes a displacement sensor between the ink supply members and the doctor blade for detecting a surface portion of the accumulated ink on the printing cylinder.

2. The printing unit according to claim 1, wherein
   the printing area area like portion is a part of a gravure printing cylinder immediately upstream the doctor blade wiping an excess ink off the gravure printing cylinder.

3. The printing unit according to claim 1, wherein
   the printing area is a part of an offset gravure printing cylinder immediately upstream the doctor blade wiping an excess ink off the offset gravure printing cylinder.

4. The printing unit according to claim 1, wherein
   each of the plurality of ink supply members includes an ink container, a pump to deliver the ink out of the container, and a nozzle to eject the ink to the printing area.

5. The printing unit according to claim 4, wherein
   the control system controls a flow rate of the ink delivered from the pump of each of the plurality of ink supply members to the nozzle so that the surface position of the ink is brought into agreement with a predetermined level.

* * * * *